US008659954B1

(12) United States Patent
Lewis et al.

(10) Patent No.: US 8,659,954 B1
(45) Date of Patent: Feb. 25, 2014

(54) CBRAM/RERAM WITH IMPROVED PROGRAM AND ERASE ALGORITHMS

(75) Inventors: Derric Lewis, Sunnyvale, CA (US); Shane Hollmer, Grass Valley, CA (US); Vasudevan Gopalakrishnan, Fremont, CA (US); John Dinh, Dublin, CA (US); Foroozan Sarah Koushan, San Jose, CA (US); Juan Pablo Saenz Echeverry, Mountain View, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 42 days.

(21) Appl. No.: 13/548,470

(22) Filed: Jul. 13, 2012

Related U.S. Application Data

(60) Provisional application No. 61/534,823, filed on Sep. 14, 2011, provisional application No. 61/534,510, filed on Sep. 14, 2011.

(51) Int. Cl.
 *G11C 7/00* (2006.01)
(52) U.S. Cl.
 USPC .............. 365/189.011; 365/189.07; 365/148; 365/185.18
(58) Field of Classification Search
 USPC .................. 365/189.07, 189.011, 148, 185.18
 See application file for complete search history.

(56) References Cited

U.S. PATENT DOCUMENTS

| 5,509,134 | A | * | 4/1996 | Fandrich et al. | 711/103 |
| 5,802,343 | A | * | 9/1998 | Fandrich et al. | 711/158 |
| 5,944,833 | A | * | 8/1999 | Ugon | 713/400 |
| 7,308,623 | B2 | * | 12/2007 | Slobodnik et al. | 714/718 |
| 7,369,430 | B2 | * | 5/2008 | Yang et al. | 365/158 |
| 7,406,559 | B2 | * | 7/2008 | Sun et al. | 711/103 |
| 7,675,805 | B2 | | 3/2010 | Ang et al. | |
| 7,702,989 | B2 | * | 4/2010 | Graef et al. | 714/780 |
| 8,023,336 | B2 | * | 9/2011 | Thiruvengadam et al. | 365/185.29 |
| 8,090,916 | B2 | * | 1/2012 | Chen et al. | 711/154 |
| 8,120,963 | B2 | * | 2/2012 | Surico et al. | 365/185.19 |
| 8,358,548 | B2 | * | 1/2013 | Manna et al. | 365/200 |
| 2011/0191526 | A1 | * | 8/2011 | Haukness et al. | 711/103 |

* cited by examiner

*Primary Examiner* — Viet Q Nguyen
(74) *Attorney, Agent, or Firm* — Michael C. Stephens, Jr.

(57) ABSTRACT

Structures and methods for controlling operation of a programmable impedance element are disclosed herein. In one embodiment, a method of controlling a programmable impedance element can include: (i) receiving a program or erase command to be executed on the programmable impedance element; (ii) selecting an operation algorithm for executing the command, where the operation algorithm is selected from among a plurality of operation algorithms by decoding at least two bits stored in a register; (iii) determining, using the register, a plurality of option variables for the selected operation algorithm, where the option variables are used to set conditions for one or more of a plurality of program and erase operations of the selected operation algorithm; and (iv) executing the command on the programmable impedance element by performing the one or more of the plurality of program and erase operations of the selected operation algorithm.

20 Claims, 13 Drawing Sheets

US 8,659,954 B1

CBRAM/RERAM WITH IMPROVED PROGRAM AND ERASE ALGORITHMS

RELATED APPLICATIONS

This application claims the benefit of U.S. Provisional Application No. 61/534,510, filed Sep. 14, 2011, which is incorporated herein by reference in its entirety, and of U.S. Provisional Application No. 61/534,823, filed Sep. 14, 2011, which is incorporated herein by reference in its entirety.

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high programming current, as well as physical degradation of the memory cell over time. Other NVM technologies, such as resistive RAM (ReRAM) and conductive bridging RAM (CBRAM), may offer relatively low power and higher speeds as compared to flash memory technologies. CBRAM utilizes a programmable metallization cell (PMC) technology, which has the potential to scale to smaller sizes than flash memory devices.

SUMMARY

Embodiments of the present invention relate to controlling operation of a programmable impedance element.

In one embodiment, a method of controlling a programmable impedance element can include: (i) receiving a program or erase command to be executed on the programmable impedance element; (ii) selecting an operation algorithm for executing the command, where the operation algorithm is selected from among a plurality of operation algorithms by decoding at least two bits stored in a register; (iii) determining, using the register, a plurality of option variables for the selected operation algorithm, where the option variables are used to set conditions for one or more of a plurality of program and erase operations of the selected operation algorithm; and (iv) executing the command on the programmable impedance element by performing the one or more of the plurality of program and erase operations of the selected operation algorithm.

Embodiments of the present invention can advantageously provide for improved program and erase algorithms relative to conventional approaches. Particular embodiments are suitable for resistive random-access memory (ReRAM) and/or conductive bridging RAM (CBRAM) memory cells. These and other advantages of the present invention will become readily apparent from the detailed description of preferred embodiments below.

DETAILED DESCRIPTION OF EMBODIMENTS

Figure 1:
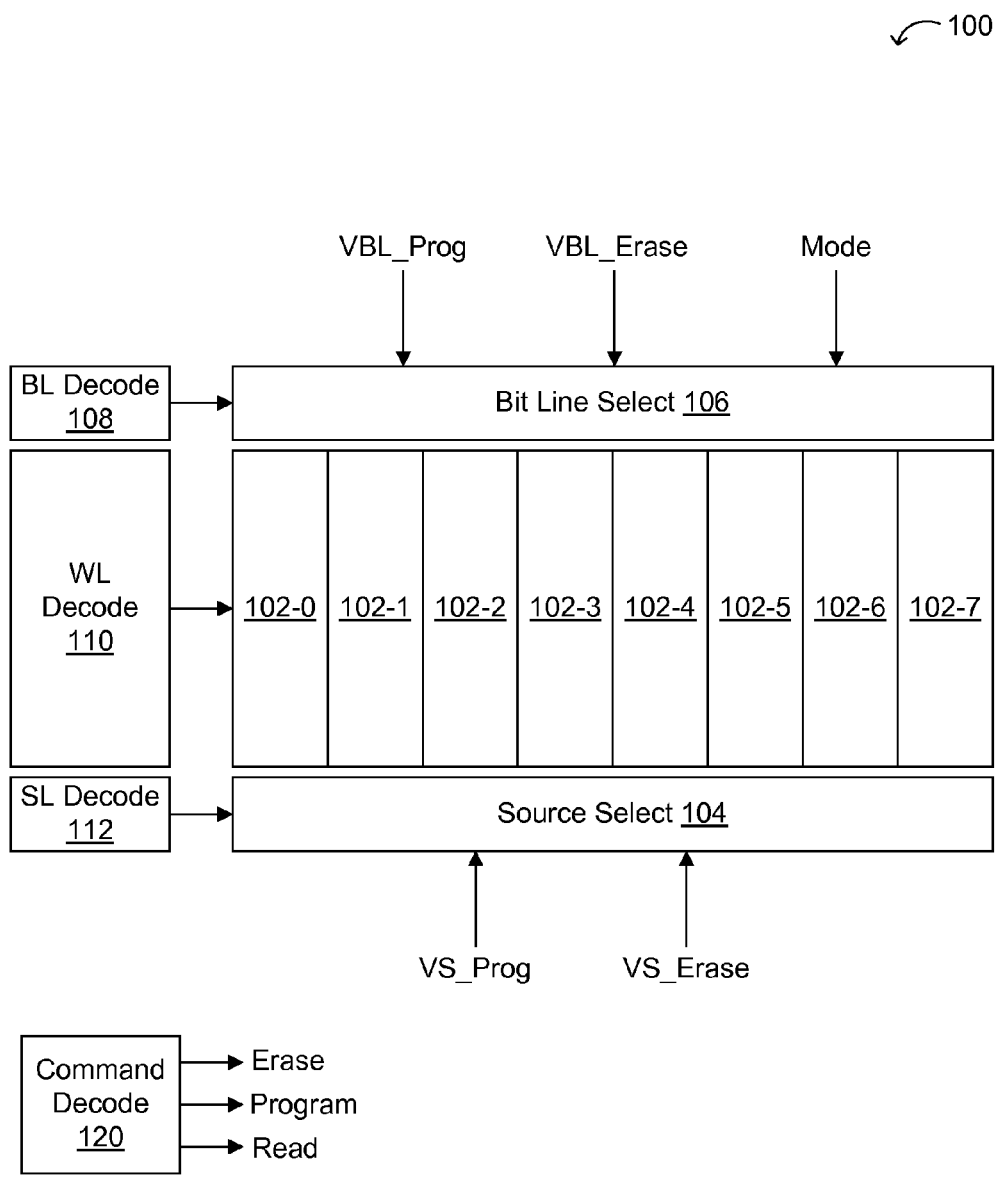
FIG. 1 is an example memory device arrangement.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Particular embodiments may be directed to programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of operating PMCs that can be programmed/written and erased between one or more resistance and/or capacitive states.

Figure 2:
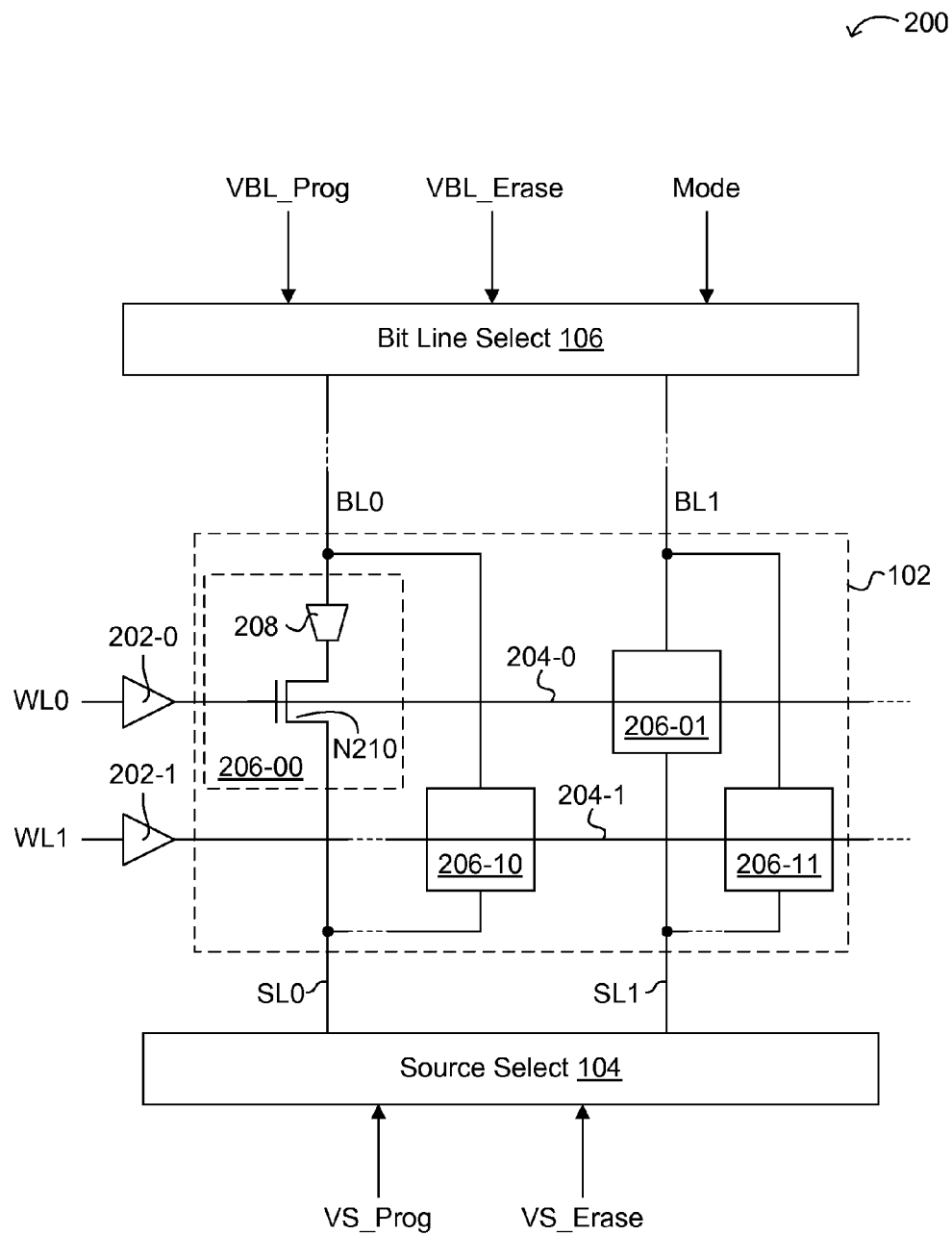
FIG. 2 is a diagram of an example memory device and memory cell structure.

FIGS. 1 and 2 show example memory architectures and circuit structures that can utilize PMCs of particular embodiments. However, PMCs of particular embodiments are suitable for use in a wide variety of memory architectures and circuit structures.

Referring now to FIG. 1, an example memory device is shown and designated by the general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., program or erase operation control signals), as will be discussed in more detail below. In this way, command decoding circuitry 120 may be used to determine an operation to be performed on the device.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, PMCs in particular embodiments are suitable for use in any type of PMC memory device architecture.

PMC sectors (102-0 to 102-7) may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be generated power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage generator (e.g., based on a reference voltage) of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_

Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1-V2) in an anode-to-cathode direction. In an erase operation, a PMC to be erased can be connected between suitable voltages (e.g., V2-V1) in an anode-to-cathode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be an erase voltage, which may both be a supply voltage (Vprog=V1-V2, Verase=V2-V1, Supply voltage=V2-V1). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 high to thereby select a memory cell 206, thus placing its corresponding access device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture. Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation (which may be part of a sequence of operations in a program "algorithm"), in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation (which may be part of a sequence of operations in an erase "algorithm") can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltages and/or currents to enable such access devices. In this way, bit line selection, source selection, and word line activation can be utilized to program and/or erase a PMC array having bit lines connected to anodes of PMCs within multiple memory cells.

While particular example architectures and circuits suitable for PMCs, and memory arrays formed thereof, with respect to FIGS. 1 and 2, programmable impedance elements in certain embodiments are suitable to a wide variety of architectures and/or circuit arrangements.

Figure 3:
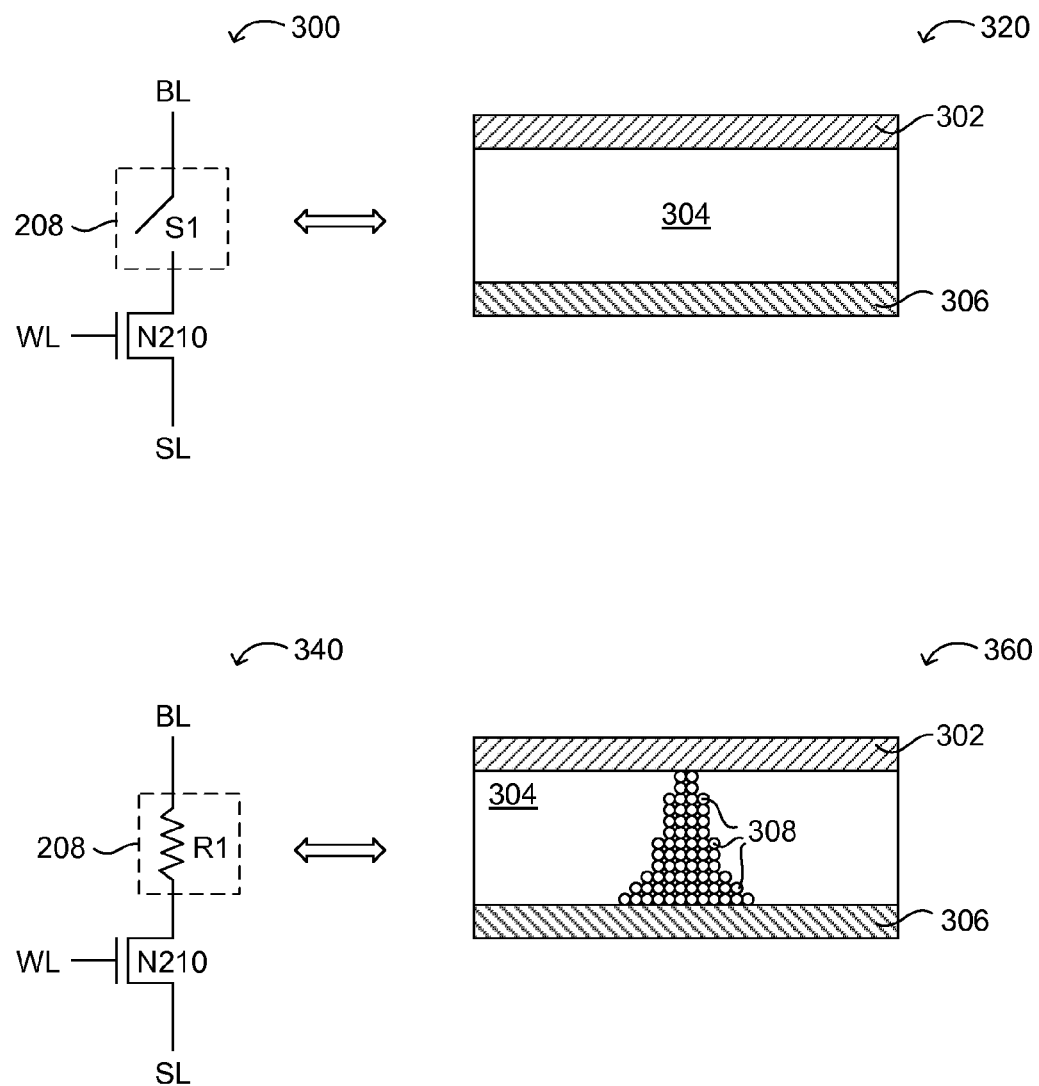
FIG. 3 is a diagram of an example programmable impedance element with schematic modeling.

Referring now to FIG. 3, shown is a diagram of an example programmable impedance element with corresponding schematic modeling. Example 300 shows a memory cell with an open switch S1 representation of PMC 208. The PMC portion of this representation corresponds to the cross-section diagram 320, which represents a PMC or programmable impedance element in a high impedance state (e.g., state "0"), or an erased state. Partially dissolved or erased states may also be detected as a data state "0," or a multi-bit value, in some applications, and depending on the read-trip point. As used herein, "PMC" may be one example of a "programmable impedance element." In this example, PMC 320 can include electrochemically active electrode 302, solid electrolyte 304, and inert electrode 306.

Schematic representation 340 and corresponding cross-section diagram 360 show examples of PMC 208 in a low impedance state (e.g., state "1"), or a programmed state. Partial conductive paths may also be detected as a data state "1," or a multi-bit value, in some applications, and depending on the read-trip point. Example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in examples 300 and 340, a control transistor (e.g., N210) can also be included in each memory cell including the programmable impedance element or PMC 208. For example, transistor N210 can be controlled by a word line 204, as discussed above with respect to FIG. 2.

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes. As shown in the cross-section diagrams herein, however, the solid electrolyte layer is shown as thicker than the electrodes for illustration purposes.

Solid electrolyte 304 can include a chalcogenide compound, such as a germanium selenium (Ge—Se) compound. Solid electrolyte 304 can be formed by photodissolution of metal into a chalcogenide base glass. Chalcogenide materials are chemical compounds consisting of at least one chalcogen ion (a chemical element in column VI of the periodic table, also known as the oxygen family). More precisely, the term chalcogenide refers to the sulphides, selenides, and tellurides, PMCs may utilize the ionic conduction of compounds containing metallic ions.

Certain metals can be added to thin films of chalcogenide glasses by photodissolution. When Ag is combined in this fashion with Ge—Se or Ge—S glasses, the resulting ternary may contain a dispersed nanocrystalline $Ag_2S(e)$ phase that has relatively large quantities of mobile metal ions. The presence of these ions allows the ternaries to act as solid electrolytes. If an anode that has an oxidizable form of the ionic metal and an inert cathode are applied in contact with such a phase-separated electrolyte, an ion current of mobile elements (e.g., positively charged metal ions) can flow under an applied voltage bias. Electrons from the cathode can reduce the excess metal due to the ion flux and an electrodeposit (e.g., 308) forms on or in the electrolyte (e.g., 304). Also, other materials, such as certain oxides (e.g., tungsten oxide, hafnium oxide, nickel oxide, titanium oxide, transition metal oxides, etc.), can be used, as opposed to Ge—S and Ge—Se chalcogenide glasses. In addition, other metals, such as copper, can be used in place of silver, for the electrochemically active electrode that supplies mobile ions.

Various materials can be utilized to form electrodes 302 and 306. For example, inert electrode 306 can include tungsten, and electrochemically active electrode 302 can include silver or copper. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 μA). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "1" data value stored in that cell. However, if there is no nanowire or conductive path between electrodes in the cell (e.g., 320), the resistance is higher, leading to low current, and that can be read as a "0" data value stored in that cell.

Cell data can be erased in similar fashion to cell writing or programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC can be substantially symmetric to a program or write operation.

Thus in conductive bridging random-access memory (CBRAM) applications, metal ions can dissolve readily in the material (e.g., 304) between the two electrodes (e.g., 302 and 306). In contrast, in resistive RAM (ReRAM) applications, the material between the electrodes may require a high electric field that can cause local damage in may produce a trail of conducting defects (a "filament"). Thus, for CBRAM, one electrode provides the dissolving ions, while for ReRAM, a one-time "forming" step may be required to generate the local damage.

However, many CBRAM/ReRAM program or erase operation failures can be stochastic in nature, and may be a function of how the cell was most recently programmed or erased (e.g., full or some partial dissolving of the conductive path). Also, more voltage, current, or time for subsequent attempts at programming or erasing a given storage cell may not necessarily provide suitable results. Further, cell response to pulse width may not necessary be linear, and there is a probability that some cells may need an order of magnitude longer pulse in order to successfully program or erase such cells.

Example Method of Controlling a Programmable Impedance Device

In one embodiment, a method of controlling a programmable impedance element can include: (i) receiving a program or erase command to be executed on the programmable impedance element; (ii) selecting an operation algorithm for executing the command, where the operation algorithm is selected from among a plurality of operation algorithms by decoding at least two bits stored in a register; (iii) determining, using the register, a plurality of option variables for the selected operation algorithm, where the option variables are used to set conditions for one or more of a plurality of program and erase operations of the selected operation algorithm; and (iv) executing the command on the programmable impedance element by performing the one or more of the plurality of program and erase operations of the selected operation algorithm.

Particular embodiments can include a selectable operation algorithm for executing a program or erase command by performing one or more of a plurality of program and erase operations. Thus, a command supplied to a memory device and decoded (e.g., via 120) as a program may be carried out on a semiconductor memory device according to the selected program operation algorithm. Further, the selected program operation algorithm can include one or more program and erase operations, each with conditions determinable by option variables, which may be accessible from a register. Similarly, a command decoded as an erase command may be carried out on a semiconductor memory device according to the selected erase operation algorithm. Further, the selected erase operation algorithm can include one or more of erase and program operations, each with conditions determinable by option variables, which may be accessible from a register. As will be discussed in more detail below, example program/erase operations may be represented as "PR" or "ER" and corresponding sets of conditions (e.g., pulse widths, voltages, currents, etc.) thereof can be indicated by numbers. Thus for example, various operations within a program or erase operation algorithm can be represented herein as PR, PR1, PR2, PR3, ER, ER1, ER2, and ER3.

In addition, a retry operation can be included in some of the program and erase operations, as defined by the particular algorithm. In a retry operation, a previous program or erase operation is repeated up until a maximum retry count value is reached. Also, one of the operations can involve increasing program or erase pulses by an order of magnitude if the initial set of pulses and retry does not work. Particular embodiments include the selection of several built-in algorithms with various tradeoffs for performance and reliability. This allows product die to be configured according to application and process.

Figure 4:
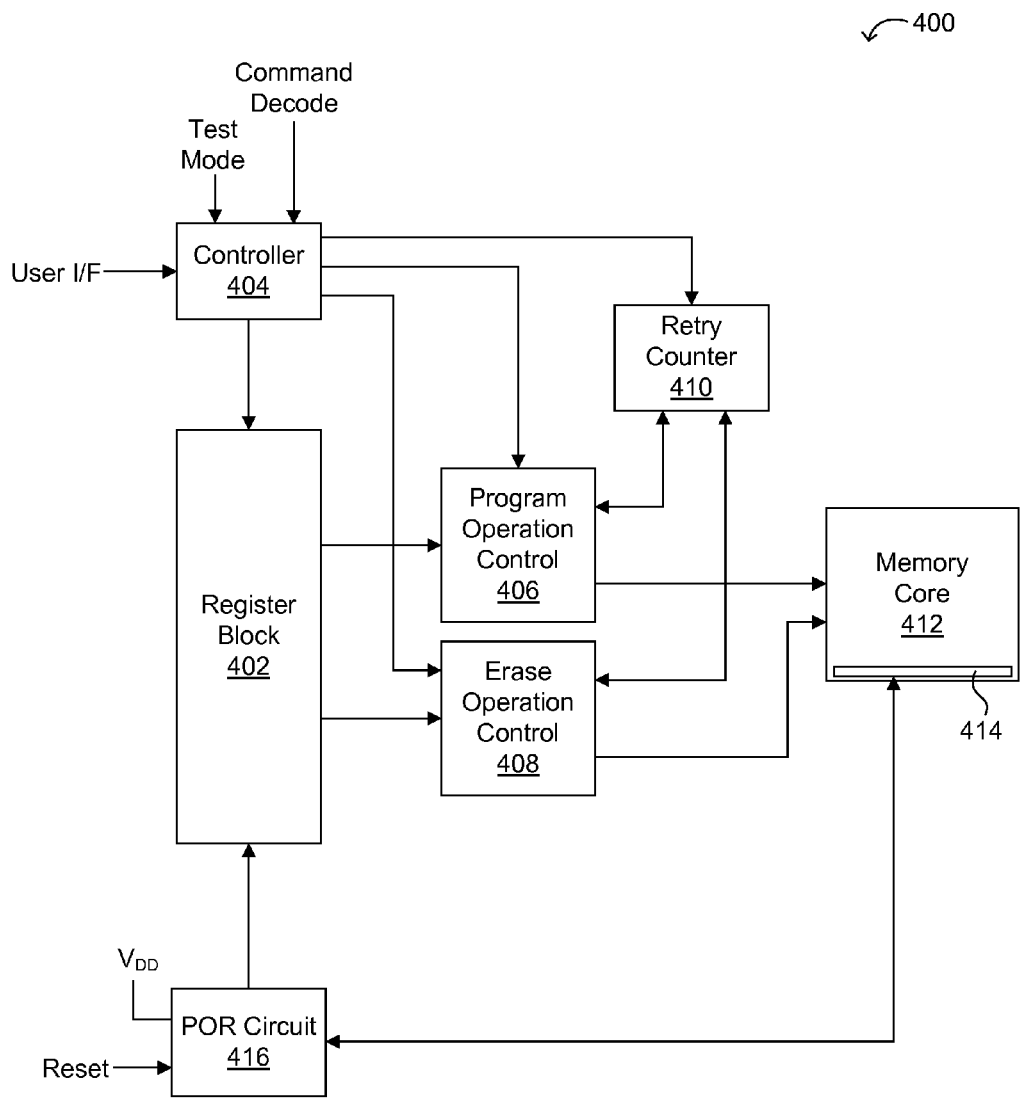
FIG. 4 is a schematic block diagram of an example register, control, and memory array structure, in accordance with embodiments of the present invention.

Referring now to FIG. 4, shown is a schematic block diagram 400 of an example register, control, and memory array structure, in accordance with embodiments of the present invention. For example, register block 402 can be implemented using static random access memory (SRAM). Register block 402 can provide algorithm and option variable selections to program operation control 406 and erase operation control 408. Controller 404 may determine and decode the received command, and can also control access to the register bits in register block 402. In addition, test modes (e.g., to determine distribution, etc.) can be used to override data in register block 402. Settings for register block 402 may be based on various default algorithm and option variable or condition settings, but can also be programmed on lot-by-lot or device-by-device basis. Also, values for program operations, erase operations, and option variable or related condition settings, can be independently programmed in register block 402.

Power on reset (POR) circuitry or state machine 416, which can receive a reset signal, can access designated register data portion 414 and read out data from that dedicated section of memory array 412. Designated register data portion 414 may alternatively be located outside of memory core 412. In any event, this accessed data that is associated with memory core 412 may then be loaded into register block 402. In this way, information specific to this device can be programmed into the memory core, and whenever the device is powered on (e.g., as detected by $V_{DD}$ supply) or otherwise reset, this data can be loaded into register 402. This is because the memory core, including designated register data portion 414 may include non-volatile memory. Also, different applications-based information can be stored in non-volatile memory designated register data portion 414. Further, different parts or memory cores 412 can be independently programmed (e.g., for different applications, etc.). In some cases, this dedicated portion of memory may not be accessible to the user. However, some applications may allow access to these designated locations, such as in a test mode.

Also, the non-volatile memory cells in designated register data portion 414 may be substantially identical to those in a remaining portion of memory core 412. For example, memory core 412 can include a plurality of memory cells that each can include a programmable impedance element or PMC. However, in some cases there may be some variety between the cells (e.g., programmable impedance element-based cells) of designated register data portion 414 relative to the cells found in other portions of memory core 412. For example, the cells of designated register data portion 414 may have a substantially similar structure relative to the other cells, but in order to accommodate higher retention for the critical data stored therein, the cells of designated register data portion 414 may be varied so as to provide improved retention.

In one or more test modes, controller 404 can override one or more values stored in register 402. When the test mode is complete, data in register block 402 can revert to the data that was previously stored in the register. For example, registers 402 may be implemented as two storage bits per register cell, one such bit representing an override value that is only enabled during predetermined modes (e.g., test mode, etc.), and another bit storing the data programmed outside of the test mode (e.g., during normal operation, power up, etc.). As another example, registers 402 may be implemented as a single bit per cell or stored data bit, and data can be reverted to its previous state by accessing designated register data portion 414 and asserting the reset signal upon completion of the test mode.

In addition, registers 402 may be programmable by controller 404 and/or by a user via a separate or combined user interface. In this way, a user may be able to program data into registers 402 in order to override or change previous values therein. Particular embodiments may also support independently controlled program/erase algorithm selection for different memory cores 412. For example, controller 404 can set the register values in 402 different for different memory cores 412. For example, register block 402 may include dedicated sectors (e.g., a widened register or increased register bit length) for each memory core, or register block 402 may be replicated for each memory core 412. This may be utilized whereby one memory array 412 is dedicated to one application (e.g., code), while another memory array 412 may be dedicated to another application (e.g., data). In this way, register block 402 may accommodate independently programmable operation algorithms in support of different operations for different memory cores 412.

As shown below in Tables 1-3, various program/erase operation algorithm information can be stored in register block 402. For example, at least two bits can be used to indicate which of a predefined group of program algorithms is to be used to execute a program command. Similarly, at least two bits in register block 402 can be used to indicate which of a predefined group of erase algorithms is to be used to execute an erase command. Further, option variables that define conditions (e.g., pulse widths, voltage levels, current levels, etc.) for the program and erase operations of the selected operation algorithm may also be defined in register block 402. In addition, a maximum number of retry attempts, which may be embedded within one or more of the program/erase algorithms may also be stored in register block 402. For example, retry counter 410 may keep track of a number of attempts for a given program or erase operation, or a sequence of program and/or erase operations, as part of a selected program/erase operation algorithm.

Particular embodiments may also support dynamically changing the operation algorithm as the semiconductor device ages, or arrays thereof are cycled more and more. For example, counters may be used to move to different algorithm and/or option variable selections and effectively change the program/erase algorithms to be used based on the counter results. In one example, designated register data portion 414 can be updated to reflect changed algorithm selections, option variables, etc., values based on such counter results. As a result, register block 402 can be updated via POR circuit 416, as discussed above. In another example, incremented values based on the counter results can be dynamically determined based on data output from register block 402. In this case, data that is read from register block 402 can then be updated by subsequent circuitry based on the counter results, before being provided as outputs to program operation control 406 and erase operation control 408.

Figure 5:
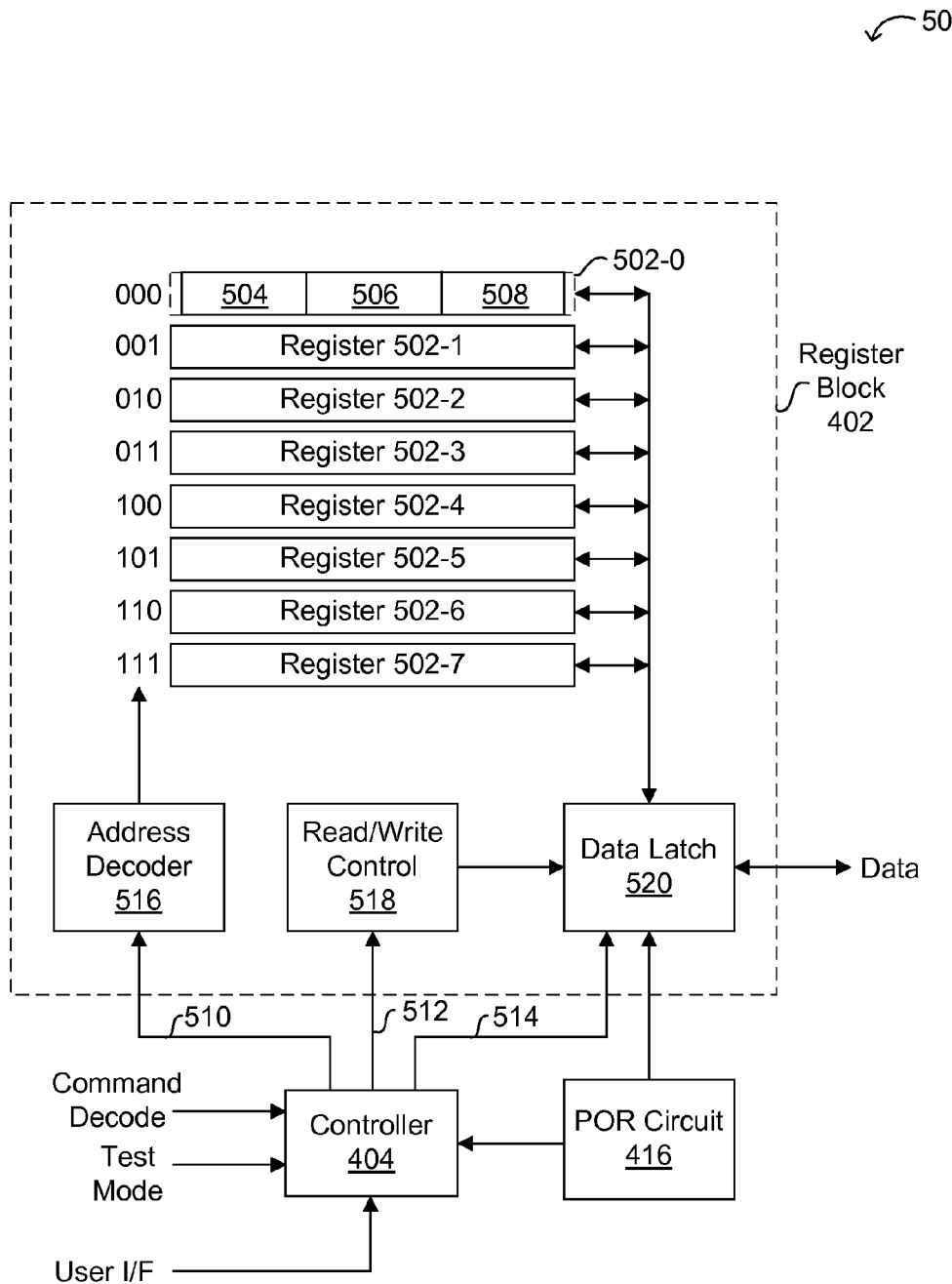
FIG. 5 is a schematic block diagram of an example register control structure in accordance with embodiments of the present invention.

Referring now to FIG. 5, shown is a schematic block diagram 500 of an example register control structure in accordance with embodiments of the present invention. In this example, register block 402 can include eight registers 502 (e.g., 502-0, 502-1, . . . 502-7). Each register 502 can include a number of fields. For example, field 504 may be a 2-bit wide field to store data representing erase operation algorithms (see, e.g., Table 1 below). Also for example, field 506 may be a 2-bit wide field to store data representing program operation algorithms (see, e.g., Table 2 below). Also for example, field 508 may be a 2-bit wide field to store data representing retry loops (see, e.g., Table 3 below). Other fields (not shown) may be used to indicate option variables to set conditions for the various algorithms. Various fields of registers 502 may generally be used to form or support a conditions table that may be accessed (e.g., by program operation control 406, erase operation control 408, etc.) to set the conditions for one or more of the program and erase operations of a selected operation algorithm.

Register block 402 can also include address decoder 516, which can receive signals 510 (e.g., address, address load, etc.) from controller 404, and may provide 3-bit decoded values to address one of eight registers 502. Read/write control 518 can receive signals 512 (e.g., read control signal, write control signal, etc.) from controller 404, and may provide a control signal to data latch 520. Data latch 520 can receive signals 514 (e.g., read data strobe, data out enable, load data, etc.) from controller 404, and may receive or provide the data to/from register block 402.

Also, while only eight registers are shown in the particular example of FIG. 5, any suitable number of registers can be accommodated in particular embodiments. For example, 24 registers can be included, where each register is 8-bits wide. In addition, such registers may support other programmable impedance device-based functions, such as word line voltage level, compliance current (e.g., where the cell is programmed until reaching this compliance current, X µA), equalization pulse width, single ended or differential sense amplifier configuration, as well as any number of other device functions and/or parameters.

Figure 6:
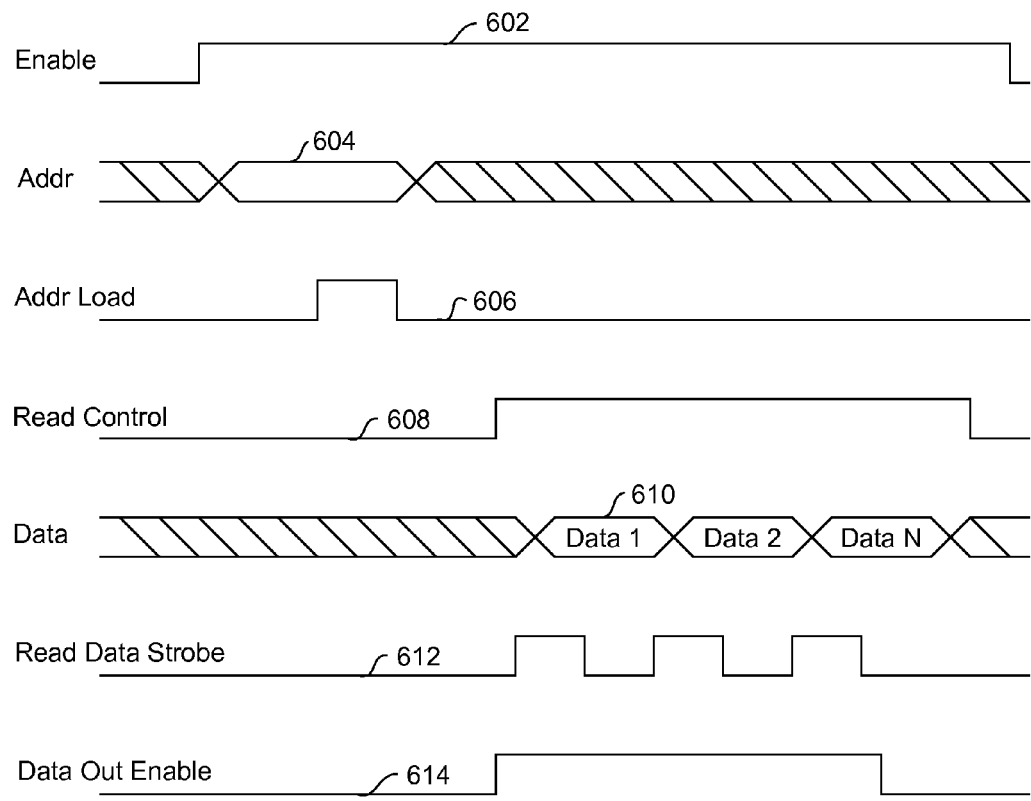
FIGS. 6 and 7 are timing diagrams showing example register read and write operations, respectively, in accordance with embodiments of the present invention.

Referring now to FIG. 6, shown is a timing diagram of example register read operations in accordance with embodiments of the present invention. One or more enable signals as shown in waveform 602 can be brought high in order to enable register access. Address signals can be provided as shown in waveform 604, along with an address load signal as shown in waveform 606. The address load signal may be used to latch the address into the address decoder 516. A read control signal 608 can be provided via signals 512 to read/write control 518. Data may be provided as shown in example waveform 610, with corresponding read data strobe as shown in waveform 612, and data out enable as shown in waveform 614. Each time the read data strobe signal is pulsed, an address counter in address decoder 516 may increment the address by one in order to read from a next register 502. Also, the address may rollover (e.g., from 111 to 000) when a highest address is reached. In this way, data from the entire register block 402 can be read in a multi-register read operation. Alternatively, only a single designated register 502 can be read when only a single read data strobe pulse is provided.

Figure 7:
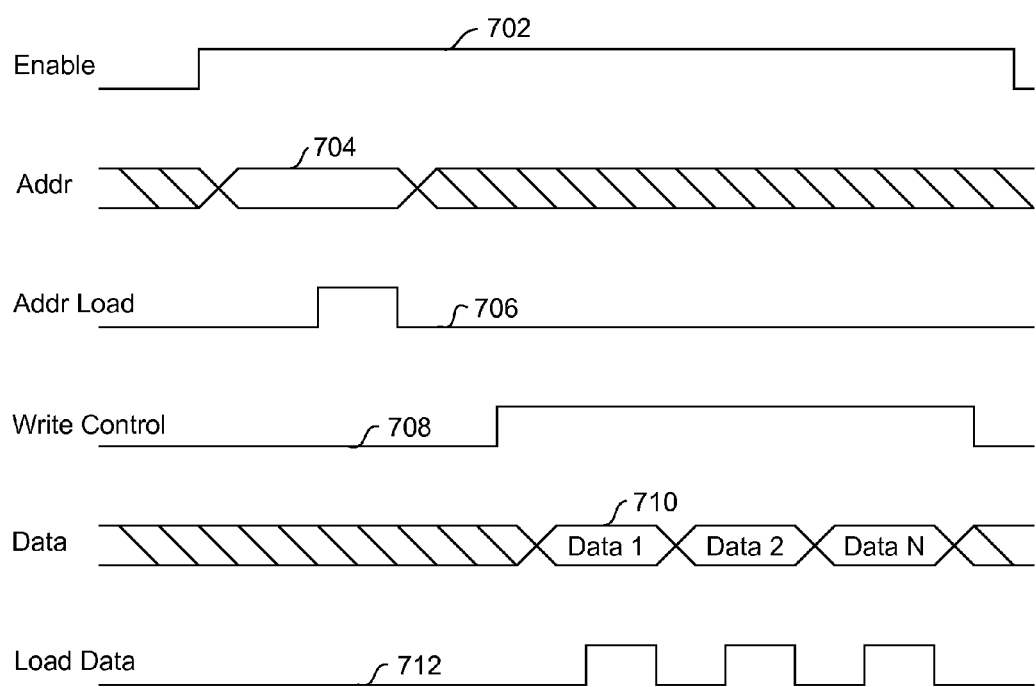

Referring now to FIG. 7, shown is a timing diagram of example register write operations in accordance with embodiments of the present invention. One or more enable signals as shown in waveform 702 can be brought high in order to enable register access. Address signals can be provided as shown in waveform 704, along with an address load signal as shown in waveform 706. The address load signal may be used to latch the address into the address decoder 516. A write control signal 708 can be provided via signals 512 to read/write control 518. Data may be provided to register block 402 as shown in example waveform 710, with corresponding load data control as shown in waveform 712. Each time the load data control signal is pulsed, an address counter in address decoder 516 may increment the address by one in order to read from a next register 502. Also, the address may rollover (e.g., from 111 to 000) when a highest address is reached. In this way, data from the entire register block 402 can be written to in a multi-register write operation. Alternatively, only a single designated register 502 can be written to when only a single load data control pulse is provided.

Figure 8:
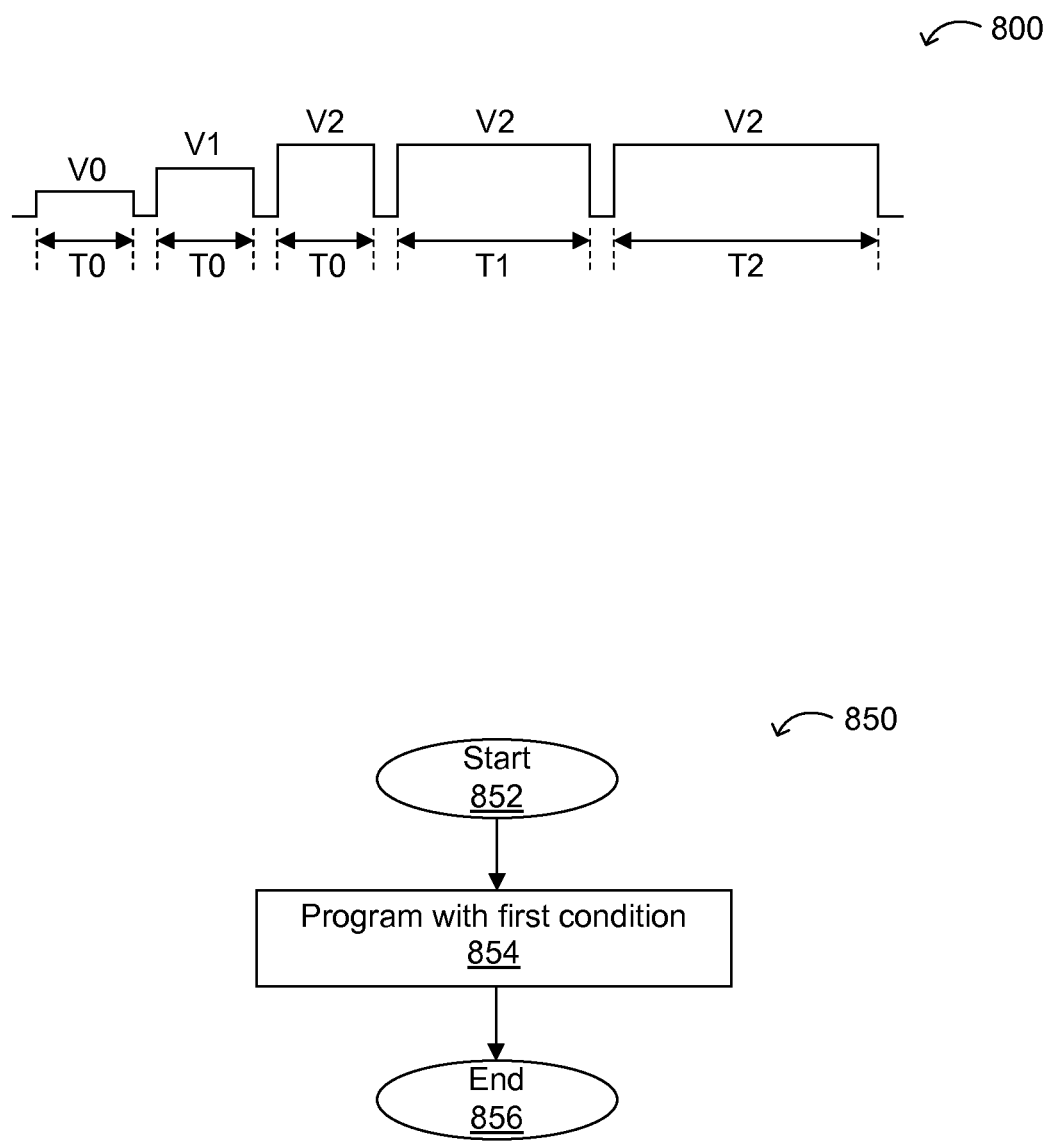
FIG. 8 is a diagram of a first program algorithm with a program pulse sequence in accordance with embodiments of the present invention.

Referring now to FIG. 8, shown is a diagram of a first program algorithm with a program pulse sequence in accordance with embodiments of the present invention. As discussed herein "algorithms" can include one or more of testing algorithms, methods, operations and/or procedures, such as one or more of a plurality of program and erase operations. In the example 800, one or more operations can include a series of program pulses with verifies in between, or a series of erase pulses with verifies in between. Also, program/erase voltage (e.g., V0, V1, V2) and/or pulse width (e.g., T0, T1, T2) may also be adjusted as a number of pulses increases. In example 850, the flow starts at 852, and at 854, a program operation with a first condition can be performed, completing the flow at 856. For example, such a first condition can include one or more of voltages and pulse widths as shown in example 800.

However, drawbacks of some such linearly increasing pulse width and/or voltage sequences include possibly not working well with CBRAM memories that have a stochastic nature of failure, and not dealing with CBRAM tradeoffs of performance and reliability. There may not be an effective linear response to the stimulus, whereby a linear program pulse string of V0/T0, V1/T0, etc., while being effective for a vast majority of cells, might be ineffective for certain outlier cells. As a result, by the time such outlier cells are programmed in this manner, the time taken to program may exceed product specifications. Each of the pulse string sequences represents an attempt to program or erase a memory cell (e.g., including a programmable impedance element). For example, some outliers may take 15 pulses or more before program/erase is successful. In particular embodiments, selectable algorithms may add on to a baseline of linear pulse increases by increasing a pulse width, e.g., by an order of magnitude (e.g., from pulse widths in the 5/10/20 μs range to a pulse width of about 100 μs), and/or by performing other program/erase operations.

Some cells may still tend to get stuck despite the increased order of magnitude of the pulse width. For these cases, particular embodiments accommodate erasing the cell first, and then attempting programming the cell again, as part of a given operation algorithm. Thus, particular embodiments utilize a variety of selectable program/erase algorithms that include regular pulse strings, a substantially larger pulse string, a retry loop, and the cell being erased prior to attempting to program the cell again. Thus, as a program or erase command (e.g., as detected by command decoder 120) is received by a memory device, internally the device can perform a sequence of operations as defined by the selected program or erase algorithm that is based on programmed register bits, as discussed above.

In particular embodiments, different stages or operations of a program or erase algorithm can include a corresponding independent set of variables for pulse widths, voltages, and/or currents. Alternatively, some of the option variables may be combined to reduce the total variable bit count. In particular embodiments, program and erase algorithms can be selected based on at least two bits found in registers 502. Table 1 below shows example erase algorithm selection options, with corresponding operation sequences that are part of the given algorithm.

TABLE 1

| Erase Algorithm | Sequence |
| --- | --- |
| 00 | ER1 |
| 01 | ER1 + ER3 |
| 10 | ER1 + [[PR + ER2] × retry] |
| 11 | ER1 + [[PR + ER2 + ER3] × retry] |

Table 2 below shows example program algorithm selection options, with corresponding operation sequences that are part of the given algorithm.

TABLE 2

| Program Algorithm | Sequence |
| --- | --- |
| 00 | PR1 |
| 01 | PR1 + PR3 |
| 10 | PR1 + [[ER + PR2] × retry] |
| 11 | PR1 + [[ER + PR2 + PR3] × retry] |

Conditions including the Vbl (bit line voltage, e.g., via bid line select 106), Tp (pulse width), and maximum attempt settings for ER1 and ER2 can be identical in some applications (effectively ER1=ER2), and different in others. For example, the Vbl and Tp condition settings for ER3 can be independent from ER1/ER2. Also for example, the maximum attempt settings for ER3 may be twice that of the maximum attempt settings for ER1/ER2 in some cases.

Also, if other predetermined bits are set, then the voltage/pulse width stepping feature for Vbl and Tp may be disabled in some cases. In this situation, five designated register bits may be utilized to set the pulse width for ER3, three other designated register bits may be utilized to set the Vbl voltage for ER1/ER2, and three other designated register bits may be utilized to set the Vbl voltage for ER3. Of course, any suitable condition settings via option variables can be accommodated via registers 502 in particular embodiments.

A number of retry loops embedded within a given operation algorithm may also be programmed in registers 502. One example of a number of retry loops that may be controlled by at least two predetermined register bits is shown below in Table 3.

TABLE 3

| Retry[1:0] | Number of Retry Loops |
| --- | --- |
| 00 | 2 |
| 01 | 4 |
| 10 | 6 |
| 11 | 11 |

Figure 9:
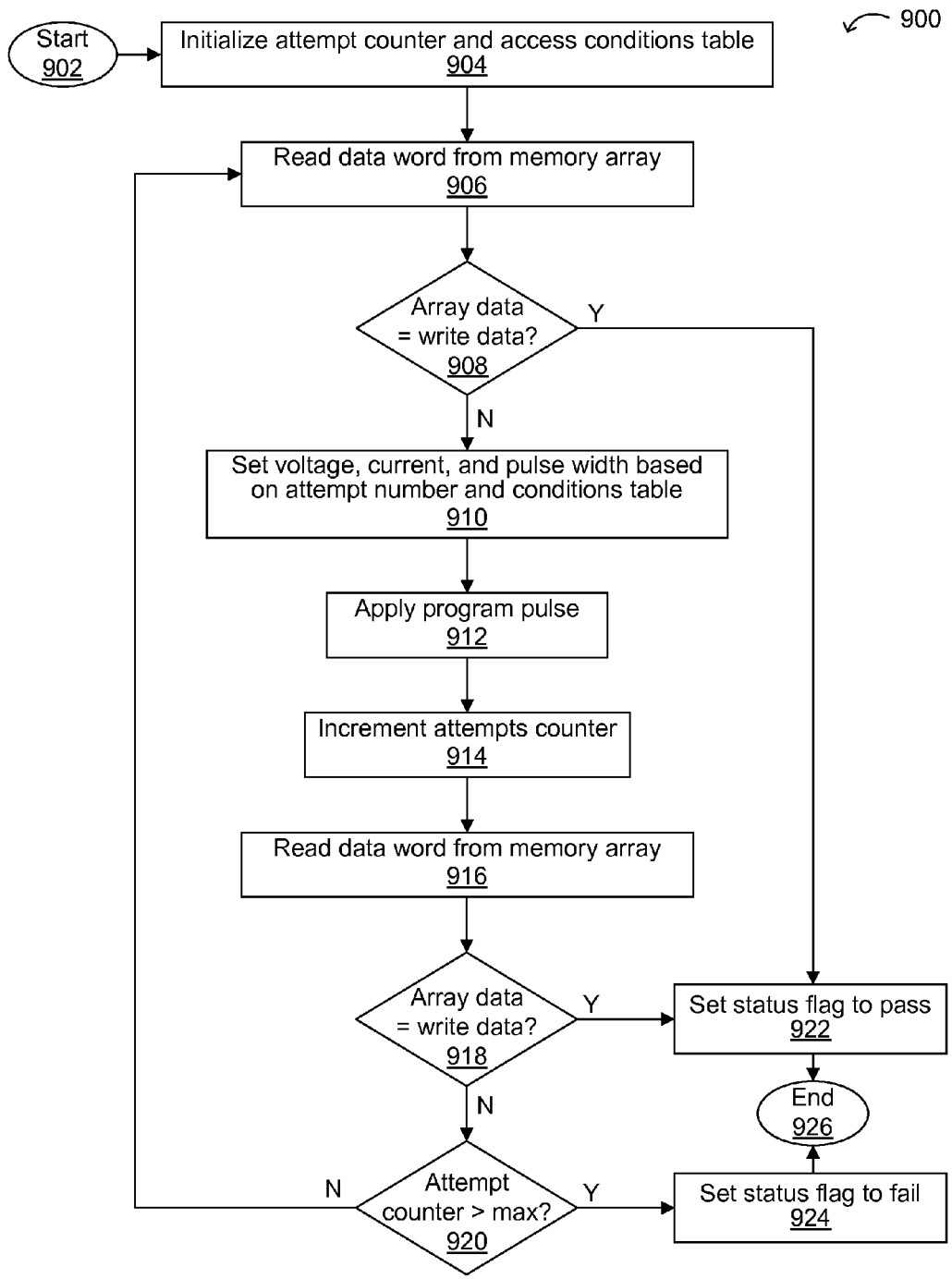
FIG. 9 is a flow diagram of an example program operation for the first program algorithm in accordance with embodiments of the present invention.

Referring now to FIG. 9, shown is a flow diagram 900 of an example program operation for the first program algorithm in accordance with embodiments of the present invention. The flow begins 902, and at 904 an attempt counter can be initialized and a conditions table may be accessed (e.g., by reading one or more of registers 502). At 906, a data word may be read from the memory array (e.g., 412). If the data read from the memory array equals the write data (908) to indicate a successful programming operation, a status flag may be set to pass at 922, completing the flow that 926.

However, if the data word read from the memory array does not equal the write data (908), at 910, voltage, current, and pulse width may be set based on the attempt number and the conditions table. At 912, the program pulse may be applied as part of another program operation. At 914, the attempt counter may be incremented. At 916, a data word may be read from the memory array for comparison against the write data. If the data read from the memory array equals the write data (918) indicating a successful program attempt, a status flag may be set to pass at 922, completing the flow at 926. However, if the data read from the memory array does not match the write data (918), a comparison of the attempt counter versus the maximum number of retries can be made at 920. If the attempt counter exceeds the maximum allowable number of retries (920), the status flag may be set to fail at 924, completing the flow at 926. However, if attempts remain (920), the flow returns to read a data word from the memory array at 906.

For example, the program operation algorithm of FIG. 9 can include the longer linearly increasing pulses as in PR1. A first program algorithm selection "00" can include PR1 indicating regular programming, which may have multiple sequences of pulse width, voltage, and additional program attempts or operations, as shown in example 800. A second program algorithm selection "01" can include a PR1 operation and an additional PR3 operation. If the pulses from PR1 are insufficient to program a memory cell, then the algorithm may skip ahead to a fixed substantially longer pulse in PR3.

A third program algorithm selection "10" can include the PR1 operation, followed by a repeatable erase (ER) and PR2 operation. PR2 may be substantially the same as PR1 in some cases, depending upon the option variables that are utilized. Thus, program algorithm selection "10" may include an erase followed by regular programming (e.g., PR2), which can be repeated depending upon a number of retry loops that are selected (see, e.g., Table 3 above).

A fourth program algorithm selection "11" can include the PR1 operation, followed by a repeatable erase, PR2, and PR3 operation. As noted above, PR3 can include a substantially large programming pulse (e.g., a magnitude larger than that of PR1 or PR2). Thus, program algorithm selection "11" may include an erase followed by regular programming (e.g., PR2) and then followed by a substantially large programming pulse programming operation (e.g., PR3), which can be repeated depending upon a number of retry loops that are selected (see, e.g., Table 3 above). As discussed above, the retry repeats that portion of the operation algorithm according to a number of retry bits set in corresponding register 502.

Thus, particular embodiments can include designated bits/registers in register block 402 that may be used in operation algorithm and/or option variable/condition selection. Also, initial values for register 402 may be accessed from designated register data portion 414 from memory array 412. In forming the initial data values for such operation algorithms, a programmable impedance element based device may be characterized to determine if each bit of the device programs relatively easily (e.g., in less than a predetermined time or cycle threshold). In which case, operation algorithms may be set to "00" representing a more standard linear pulse based program operation. However, if one or more bits of the device failed to program relatively easily (e.g., in less than a predetermined number of program pulses, as set in a characterization tester), corresponding operation algorithms may be sent to a more stringent setting (e.g., "01," "10," or "11," depending upon the relative programming difficulty).

In this way, outlier or tail bits can be accommodated in particular embodiments. Other applications of particular embodiments include cell or device aging, whereby the appropriate operation algorithm can be dynamically chosen based on the age of the cell. For example, a counter can be used to determine such an age. Typically, an early age or beginning of life may start with operation algorithm "00," and may be adjusted upward (e.g., from "00" to "01," etc.) as the cell age count increases. Further, while characterization of program and erase capabilities of a device may be utilized to set the operation algorithm via registers 402, this setting can be automatically reprogrammed based on a count of the number of cycles. Further, users can program any settings in register block 402, and thus may bypass or override the cell aging count.

Particular embodiments also provide operation algorithms that include low-level or baseline program/erase operations (e.g., PR1, ER1). Thus, even though a particular operation algorithm may be set as operation "11," the full sequence defined in such a selected operation may not be necessary if the programming works using PR1. In such a case, the program success or failure at each stage may be determined as part of the selected operation algorithm, and as such there may be no need to proceed past a successful level of the algorithm. Particular embodiments may also be suitable for any memory device with random behavior or outlier cells therein.

Figure 10:
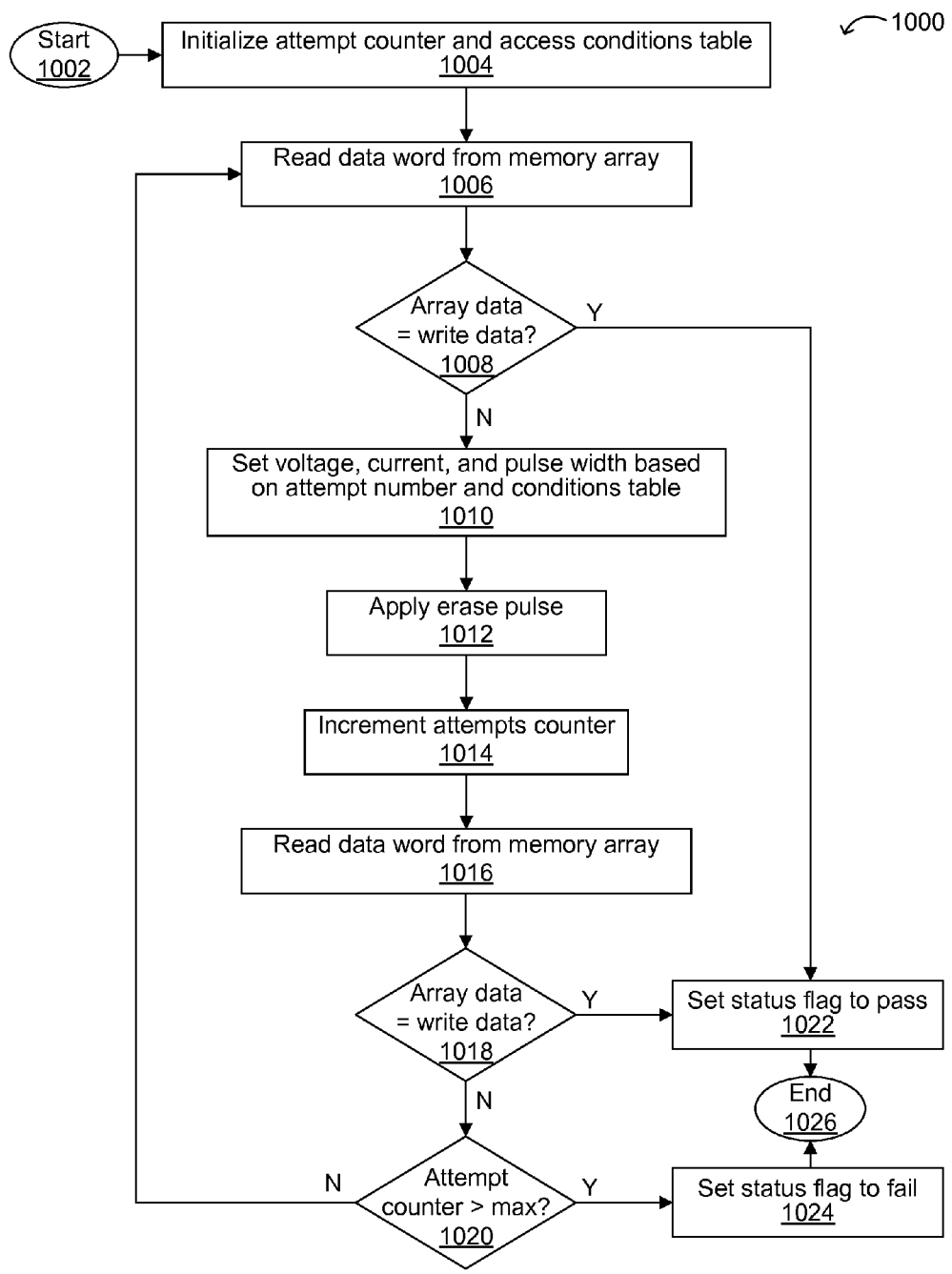
FIG. 10 is a flow diagram of an example erase operation for the first erase algorithm in accordance with embodiments of the present invention.

Referring now to FIG. 10, shown is a flow diagram 1000 of an example erase operation in accordance with embodiments of the present invention. The flow begins 1002, and at 1004 an attempt counter can be initialized and a conditions table may be accessed. At 1006, a data word may be read from the memory array. If the data read from the memory array equals the write data (1008), a status flag may be set to pass at 1022, completing the flow that 1026.

However, if the data word read from the memory array does not equal the write data (1008), at 1010, voltage, current, and pulse width may be set based on the attempt number and the conditions table. At 1012, the erase pulse may be applied to perform an erase operation. At 1014, the attempt counter may be incremented. At 1016, a data word may be read from the memory array for comparison against the write data to determine if the erase operation was successful. If the data read from the memory array equals the write data (1018), a status flag may be set to pass at 1022, completing the flow at 1026. However, if the data read from the memory array does not match the write data (1018), a comparison of the attempt counter versus the maximum number of retries can be made at 1020. If the attempt counter exceeds the maximum allowable number of retries (1020), the status flag may be set to fail at 1024, completing the flow at 1026. However, if attempts remain (1020), the flow returns to read a data word from the memory array at 1006.

Figure 11:
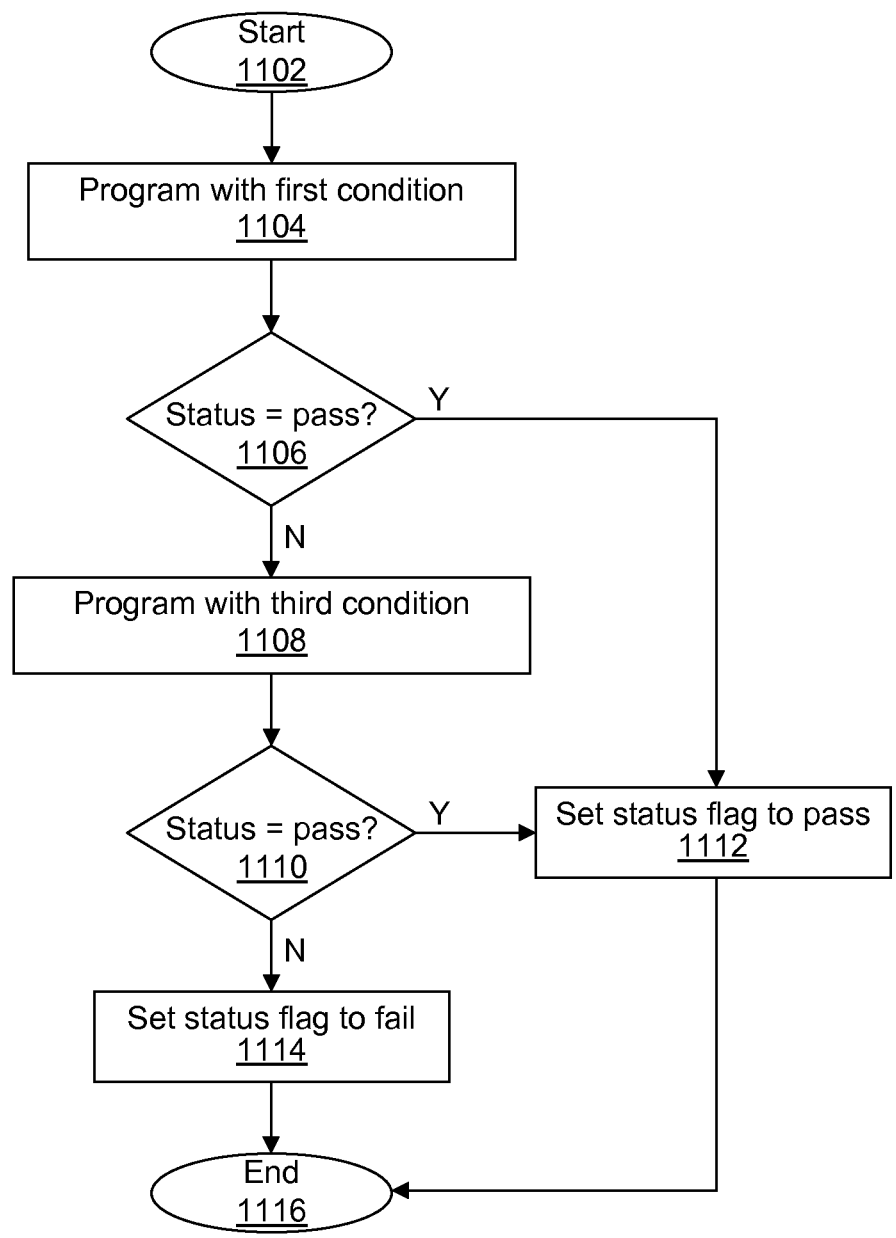
FIG. 11 is a flow diagram of a second program algorithm in accordance with embodiments of the present invention.

Referring now to FIG. 11, shown is a flow diagram 1100 of a second program algorithm in accordance with embodiments of the present invention. For example, FIG. 11 may represent an operation algorithm "01" selection, as shown above in Table 2. The flow can begin at 1102, and at 1104 a given programmable impedance element can be programmed with a first condition. For example, this program operation at 1104 may represent PR1 as discussed above. If the status of program 1104 results in a pass condition (e.g., the cell has been successfully programmed) at 1106, the status flag can be set pass at 1112, completing the flow at 1116.

However, if the program with the first condition (1104) has not been successful (1106), the given programmable impedance element can be programmed with a third condition at 1108. For example, this program operation at 1108 may represent PR3 (e.g., a substantially larger program pulse), as discussed above. If the status of program 1108 results in a pass condition at 1110, the status flag may be set pass at 1112, completing the flow at 1116. However, if the status of program 1108 result in a failed condition at 1110, the status flag may be set to fail at 1114, completing the flow at 1116.

In this way, a program operation algorithm (e.g., "01") can be selected by decoding designated bits from register 502, and may be particularly useful in effectively programming outlier programmable impedance elements. Also, the selected program algorithm can include various program operations therein (e.g., PR1, PR3) with option variables or conditions also determinable from bits from register 502. Further, while the particular example of FIG. 11 shows a program algorithm, a similar flow can be accommodated for an erase algorithm (e.g., corresponding to erase algorithm "01" as shown in Table 1).

Figure 12:
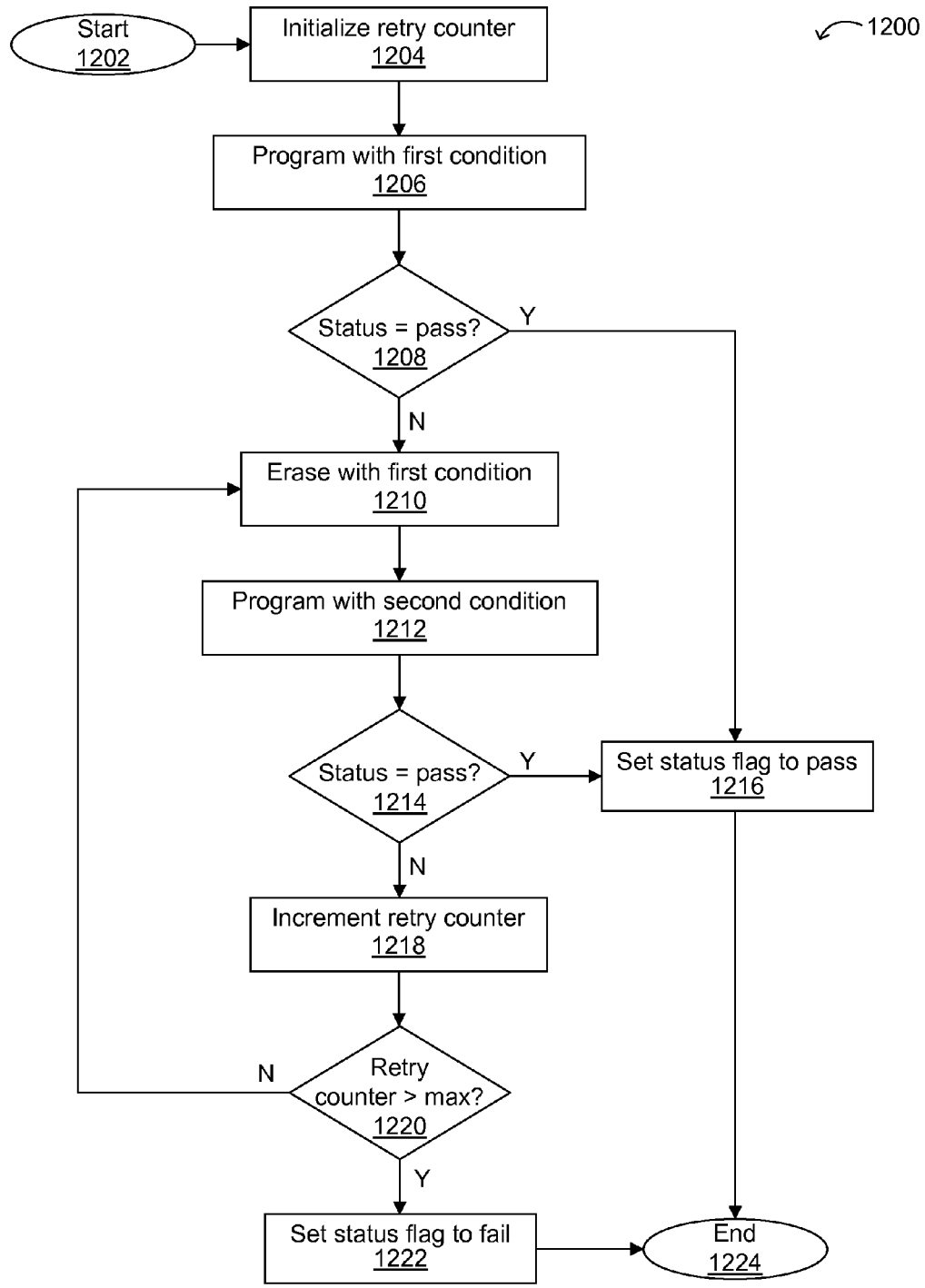
FIG. 12 is a flow diagram of a third program algorithm in accordance with embodiments of the present invention.

Referring now to FIG. 12, shown is a flow diagram 1200 of a third program algorithm in accordance with embodiments of the present invention. For example, FIG. 12 may represent an operation algorithm "10" selection, as shown above in Table 2. The flow can begin at 1202, and at 1204 a retry counter (e.g., 410) may be initialized. At 1206, a given programmable impedance element can be programmed with a first condition, thus representing PR1. If at 1208, it is determined that this program operation was successful, a status flag can be set pass at 1216, completing the flow at 1224.

However, if at 1208, it is determined that this program operation was not successful, an erase of the programmable impedance element can be performed with a first condition at 1210. Then, at 1212, a program operation with a second condition (e.g., PR2) can be performed on the given programmable impedance element. If this operation at 1212 is successful (1214), the status flag may be set to pass at 1216, completing the flow at 1224.

However, if at 1214, it is determined that the second program operation has again failed to successfully program the given programmable impedance element, the retry counter may be incremented at 1218. If at 1220, the retry counter is less than or equal to the maximum retry loop number (e.g., as programmed in registers 502, and as exemplified in Table 3), the flow can return to 1210 to repeat the erase with the first condition operation. However, if the retry counter has exceeded the maximum retry loop number (1220), the status flag may be set to fail at 1222, completing the flow at 1224.

In this way, a program operation algorithm (e.g., "10") can be selected by decoding designated bits from register 502, and may be particularly useful in effectively programming outlier programmable impedance elements. Also, the selected program algorithm can include various operations (e.g., PR1, ER, PR2) with option variables or conditions, as well as retry loop limitations, also determinable from bits from register 502. Further, while the particular example of FIG. 12 shows a program algorithm, a similar flow can be accommodated for an erase algorithm (e.g., corresponding to erase algorithm "10" as shown in Table 1).

Figure 13:
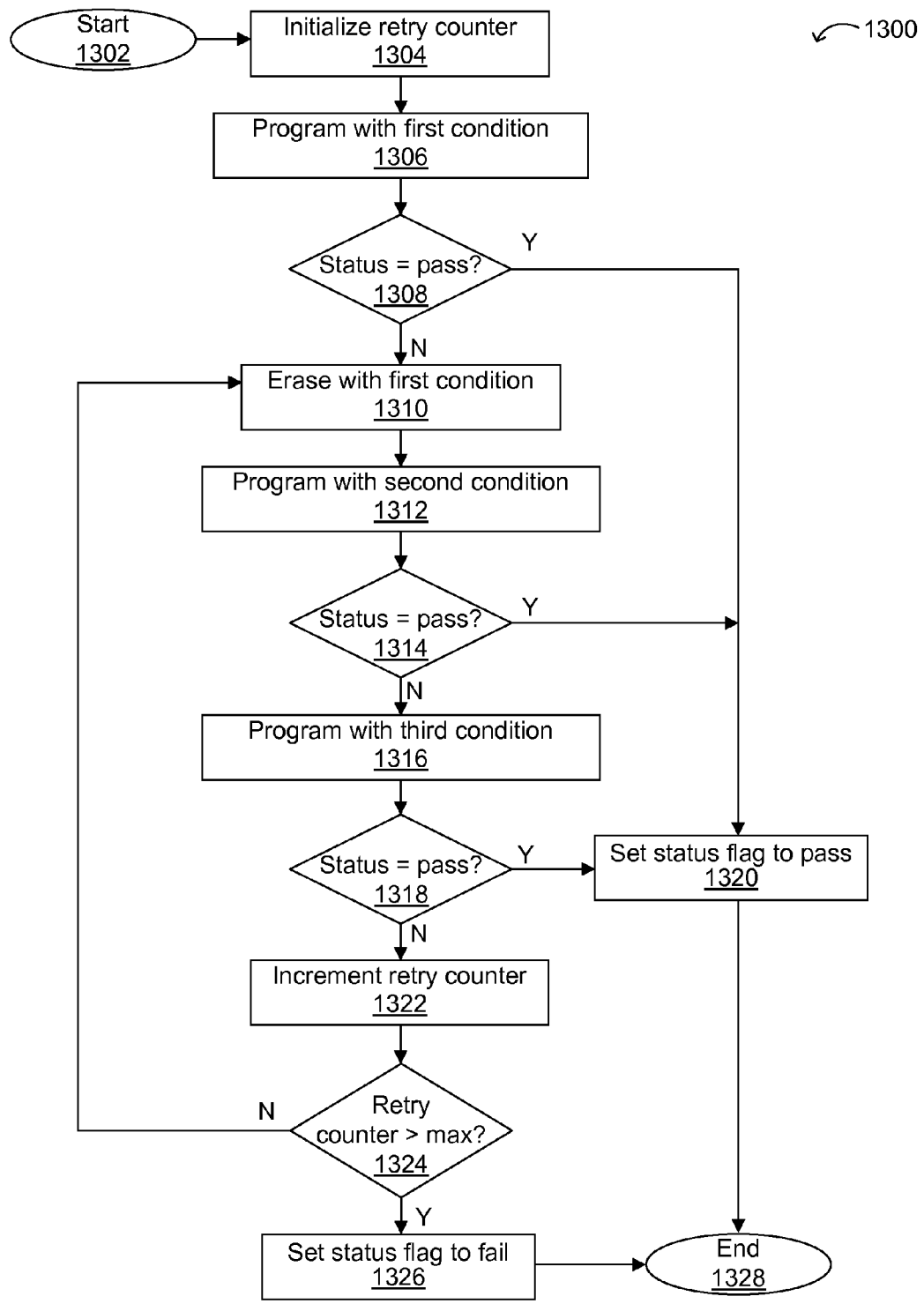
FIG. 13 is a flow diagram of a fourth program algorithm in accordance with embodiments of the present invention.

Referring now to FIG. 13, shown is a flow diagram 1300 of a fourth program algorithm in accordance with embodiments of the present invention. For example, FIG. 13 may represent an operation algorithm "11" selection, as shown above in Table 2. The flow can begin at 1302, and at 1304 a retry counter (e.g., 410) may be initialized. At 1306, a given programmable impedance element can be programmed with a first condition (e.g., PR1). If at 1308, it is determined that this program operation was successful, a status flag can be set to pass at 1320, completing the flow at 1328.

However, if at 1308, it is determined that this program operation was not successful, an erase of the programmable impedance element can be performed with a first condition at 1310. Then, at 1312, a program operation with a second condition (e.g., PR2) can be performed on the given programmable impedance element. If this operation at 1312 is successful (1314), the status flag may be set to pass at 1320, completing the flow at 1328.

However, if at 1314, it is determined that the program operation of 1312 again failed to successfully program the given programmable impedance element, a program operation with a third condition (e.g., PR3) can be performed at 1316. If this programming operation at 1316 is successful (1318), the status flag can be set to pass at 1320, completing the flow at 1328. However, if the program operation of 1316 again failed to successfully program the given programmable impedance element (1318), the retry counter may be incremented at 1322. If at 1324, the retry counter is less than or equal to the maximum retry loop number, the flow can return to 1310 to repeat the erase with the first condition operation. However, if the retry counter has exceeded the maximum retry loop number (1324), the status flag may be set to fail at 1326, completing the flow at 1328.

In this way, a program operation algorithm (e.g., "11") can be selected by decoding designated bits from register 502, and may be particularly useful in effectively programming outlier programmable impedance elements. Also, the selected program operation algorithm can include various operations (e.g., PR1, ER, PR2, PR3) with option variables or conditions, as well as retry loop limitations, also determinable from bits from register 502. Further, while the particular example of FIG. 13 shows a program algorithm, a similar flow can be accommodated for an erase algorithm (e.g., corresponding to erase operation algorithm "11" as shown in Table 1).

It is also noted that, while only two storage states (state "0" and state "1") have been significantly described herein with respect to program and erase operations, PMCs may also each support more than one memory state. For example, depending on the voltage level controls, instead of a full erase or a full program/write, partial operations (e.g., by applying less/predetermined voltages for forward bias and reverse bias of the PMC) can be performed. Such partial operations can produce different resistance values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance and bias voltage characteristics.

In addition, programmable impedance element current (e.g., versus the cell compliance current) and voltage measurements can be performed for characterization, verification or testing purposes by using the analog current or voltage to control the frequency of an on-chip clock. This on-chip clock frequency can then be measured relatively easily using an external tester during a test mode. The tester may then apply a known current/voltage to the chip and measures the clock frequency. The tester can then switch the chip to use the internal current/voltage source, and then measure the clock frequency. The difference between the two frequency measurements can be used to determine the actual on-chip current/voltage. In this way, cell characterization for purposes of selecting a suitable operation algorithm can be facilitated.

While the above examples include circuit and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of controlling a programmable impedance element, the method comprising:
   a) receiving a program or erase command to be executed on the programmable impedance element;
   b) selecting an operation algorithm for executing the command, wherein the operation algorithm is selected from among a plurality of operation algorithms by decoding at least two bits stored in a register;
   c) determining, using the register, a plurality of option variables for the selected operation algorithm, wherein the option variables are used to set conditions for one or more of a plurality of program and erase operations of the selected operation algorithm; and
   d) executing the command on the programmable impedance element by performing the one or more of the plurality of program and erase operations of the selected operation algorithm.

2. The method of claim 1, wherein the plurality of option variables comprises option variables for pulse widths, voltages, and currents.

3. The method of claim 1, wherein the plurality of option variables comprises a number of retry loops.

4. The method of claim 1, wherein the command comprises a program command.

5. The method of claim 4, wherein the selected operation algorithm for the program command comprises programming with a first condition.

6. The method of claim 5, wherein the selected operation algorithm for the program command comprises programming with a third condition if the programming with the first condition results in a failure to program the programmable impedance element.

7. The method of claim 6, wherein the selected operation algorithm for the program command comprises:
   a) setting a status flag to fail if the programming with the third condition results in a failure to program the programmable impedance element; and
   b) setting a status flag to pass if either of the programming with the first or third conditions results in successful programming of the programmable impedance element.

8. The method of claim 4, wherein the selected operation algorithm for the program command comprises:
   a) initializing a retry counter;
   b) programming with a first condition; and
   c) setting a status flag to pass if the programming with the first condition results in successful programming of the programmable impedance element.

9. The method of claim 8, wherein if the programming with the first condition results in a failure to program the programmable impedance element, the selected operation algorithm for the program command comprises:
   a) erasing with a first condition;
   b) programming with a second condition; and
   c) setting a status flag to pass if the programming with the second condition results in successful programming of the programmable impedance element.

10. The method of claim 9, wherein if the programming with the second condition results in a failure to program the programmable impedance element, the selected operation algorithm for the program command comprises:
   a) incrementing the retry counter; and
   b) returning to the erasing with the first condition if the retry counter is less than or equal to a predetermined maximum.

11. The method of claim 9, wherein if the programming with the second condition results in a failure to program the programmable impedance element, the selected operation algorithm for the program command comprises:
   a) programming with a third condition;
   b) setting a status flag to pass if the programming with the third condition results in successful programming of the programmable impedance element.

12. The method of claim 11, wherein if the programming with the third condition results in a failure to program the programmable impedance element, the selected operation algorithm for the program command comprises:
   a) incrementing the retry counter; and
   b) returning to the erasing with the first condition if the retry counter is less than or equal to a predetermined maximum.

13. The method of claim 1, wherein the command comprises an erase command.

14. The method of claim 1, further comprising:
   a) reading data from a designated register data portion of a memory array, wherein the memory array comprises the programmable impedance element; and
   b) programming the register with the data read from the designated register data portion.

15. The method of claim 14, wherein the memory array comprises a plurality of memory cells, wherein each of the memory cells comprises:
   a) a programmable impedance element having an active electrode coupled to a bit line; and
   b) a transistor having a drain coupled to the inert electrode of the programmable impedance element, a gate coupled to a word line, and a source coupled to a source line.

16. The method of claim 1, wherein the programmable impedance element comprises:
   a) an inert electrode coupled to a first side of a solid electrolyte;
   b) an active electrode coupled to a second side of the solid electrolyte, wherein the programmable impedance element is programmed by formation of a conductive path between the active and inert electrodes; and
   c) a plurality of mobile elements derived from the active electrode, wherein the plurality of mobile elements are reduced in the solid electrolyte to form the conductive path.

17. The method of claim 16, wherein the conductive path in the programmable impedance element is formed by application of a first voltage across the active and inert electrodes, the conductive path remaining once formed after the first voltage is removed.

18. The method of claim 16, wherein at least a portion of the conductive path is dissolved to erase the programmable impedance element by application of a second voltage across the active and inert electrodes.

19. The method of claim 1, further comprising overriding the data in the register during a test mode.

20. An apparatus for controlling a programmable impedance element, the apparatus comprising:
   a) means for receiving a program or erase command to be executed on the programmable impedance element;
   b) means for selecting an operation algorithm for executing the command, wherein the operation algorithm is selected from among a plurality of operation algorithms by decoding at least two bits stored in a register;
   c) means for determining, using the register, a plurality of option variables for the selected operation algorithm, wherein the option variables are used to set conditions for one or more of a plurality of program and erase operations of the selected operation algorithm; and
   d) means for executing the command on the programmable impedance element by performing the one or more of the plurality of program and erase operations of the selected operation algorithm.

* * * * *